United States Patent
La Rosa

(10) Patent No.: US 7,414,893 B2
(45) Date of Patent: Aug. 19, 2008

(54) EEPROM MEMORY ARCHITECTURE

(75) Inventor: Francesco La Rosa, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 22 days.

(21) Appl. No.: 11/436,114

(22) Filed: May 17, 2006

(65) Prior Publication Data

US 2006/0262603 A1 Nov. 23, 2006

(30) Foreign Application Priority Data

May 18, 2005 (FR) .................................. 05 04946

(51) Int. Cl.
*G11C 11/34* (2006.01)
(52) U.S. Cl. .............................. 365/185.23; 365/185.29
(58) Field of Classification Search ............ 365/185.11, 365/185.29, 185.1, 185.23
See application file for complete search history.

(56) References Cited

U.S. PATENT DOCUMENTS

| | | | | |
|---|---|---|---|---|
| 4,375,087 A | * | 2/1983 | Wanlass | ...................... 365/218 |
| 4,503,524 A | * | 3/1985 | McElroy | ................ 365/185.26 |
| 5,267,196 A | * | 11/1993 | Talreja et al. | .......... 365/185.11 |
| 5,270,980 A | * | 12/1993 | Pathak et al. | ........... 365/185.12 |
| 5,592,415 A | * | 1/1997 | Kato et al. | ............. 365/185.01 |
| 5,668,757 A | * | 9/1997 | Jeng | ...................... 365/185.26 |
| 5,677,871 A | | 10/1997 | Pio et al. | |
| 5,862,082 A | * | 1/1999 | Dejenfelt et al. | ....... 365/185.33 |
| 5,963,478 A | | 10/1999 | Sedlak | |
| 6,380,636 B1 | * | 4/2002 | Tatsukawa et al. | .......... 257/390 |
| 6,757,196 B1 | * | 6/2004 | Tsao et al. | ............. 365/185.17 |
| 2002/0054501 A1 | * | 5/2002 | Honigschmid et al. | ...... 365/145 |
| 2003/0048661 A1 | * | 3/2003 | Sakui et al. | ............ 365/185.14 |
| 2005/0127428 A1 | * | 6/2005 | Mokhlesi et al. | ............ 257/315 |

* cited by examiner

*Primary Examiner*—A. Zarabian
*Assistant Examiner*—Fernando N Hidalgo
(74) *Attorney, Agent, or Firm*—Lisa K. Jorgenson; Robert Iannucci; Seed IP Law Group PLLC

(57) ABSTRACT

An electrically erasable and programmable memory in which control gate transistors have been suppressed includes memory cells each with an access transistor and a floating gate transistor. A word line decoder is connected to word lines of the memory cells by a selection line connected to the gate terminals of the access transistors of the word line, and by a control gate line connected to the control gates of the floating gate transistors of the word line. Thus the voltage applicable to the gate terminals of the floating gate transistors is no longer limited by the voltage susceptible of being obtained on the source terminal of the control gate transistors.

24 Claims, 5 Drawing Sheets

Priort Art

Priort Art

Priort Art

US 7,414,893 B2

EEPROM MEMORY ARCHITECTURE

BACKGROUND OF THE INVENTION

1. Field of the Invention

The present invention relates to electrically erasable and programmable memories.

The present invention more particularly relates to an erasable and programmable memory, comprising memory cells, each incorporating a floating gate transistor connected in series with MOS access transistor.

2. Description of the Related Art

Figure 1:
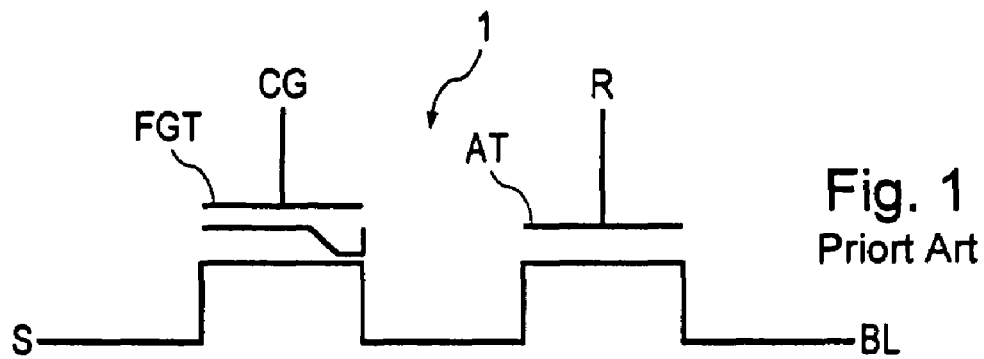

FIG. 1 represents an example of EEPROM memory cell of the type mentioned hereinbefore, comprising a floating gate transistor FGT which drain terminal is connected to the source terminal of an access transistor AT. The gate terminal of the AT transistor is connected to a word line R and the drain terminal of the AT transistor is connected to a bit line BL.

Figure 2A:
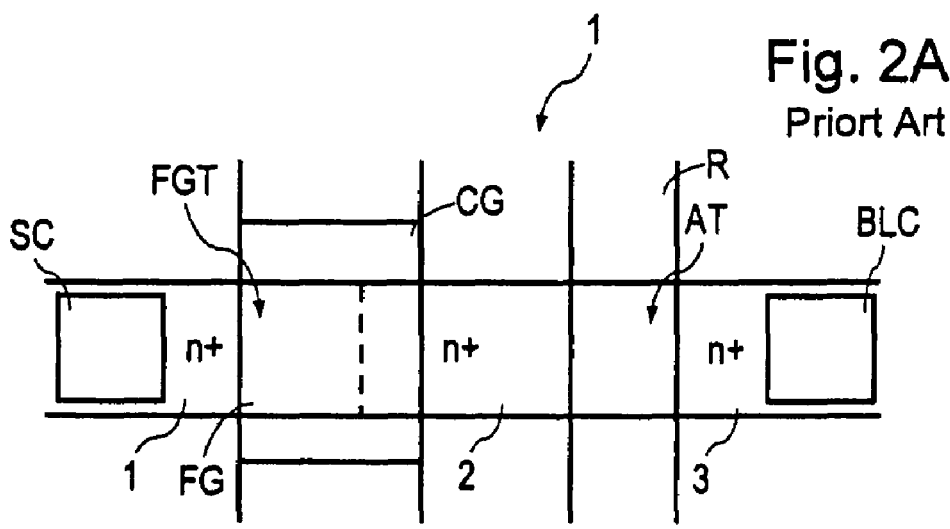
Figure 2B:
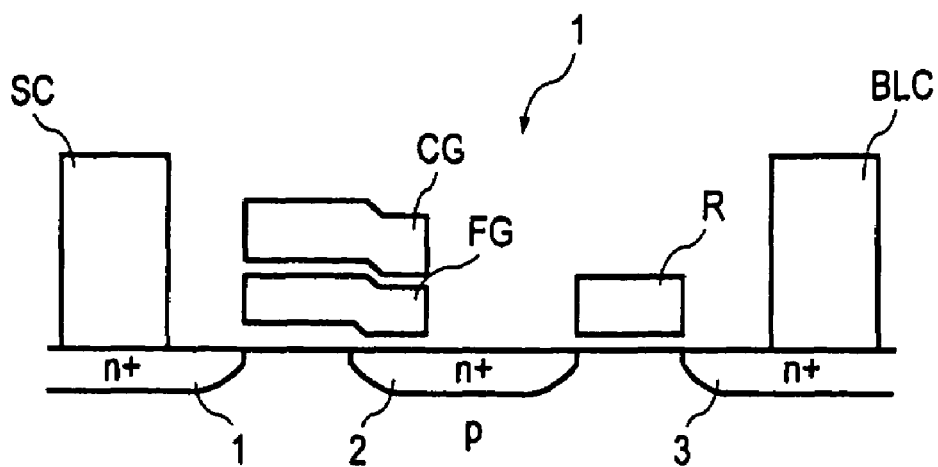

FIGS. 2A and 2B show the cell represented in FIG. 1 in top view and cross-sectional view, respectively. The cell is embedded in a substrate type p in which three regions 1, 2, 3 doped n+ are formed, respectively constituting the region of the drain of the FGT transistor, the region of the source of the AT transistor, and eventually the region of the drain of the AT transistor. The memory cell comprises:

a source terminal SC of the transistor FGT, embedded on the source region 1 of the FGT transistor, a floating gate FG and a control gate CG of the transistor FGT, superimposed, which are formed above an intermediate region between regions 1 and 2, and above a portion of region 2, a gate terminal R of the AT transistor formed above an intermediate region between regions 2 and 3, and a drain terminal BLC of the AT transistor, formed on the drain region 3 of the AT transistor.

The operation of such a memory cell is based upon the tunneling effect (or Fowler-Nordheim effect) and consists in causing moves of the threshold voltage of the FGT transistor by transferring or removing charges into/from the floating gate FG through a thin oxide layer located between the doped region 2 and the floating gate. An erasing or programming operation of the memory cell consists of injecting or extracting electrical charges into/from the floating gate of the FGT transistor by Fowler-Nordheim effect. The FGT transistor has a threshold voltage VT1 (equal to approximately −2 V) in programming state, and a threshold voltage VT2 superior to the voltage VT1 (equal to approximately 4 V) in erasing state. When a read voltage Vread comprised between VT1 and VT2 is applied to its control gate CG, the transistor FGT remains in blocking state if it is erased, which conventionally corresponds to a logic "0", and it is in conducting state if it is programmed, which corresponds to a logic "1". It will be understood that an inverse convention can be retained.

Figure 3:
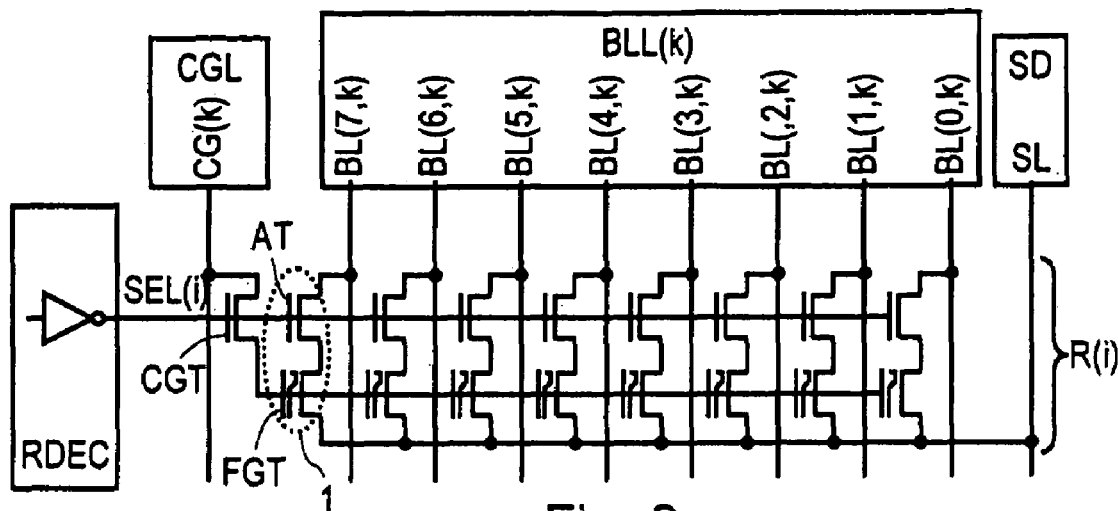

FIG. 3 represents an example of EEPROM memory of the type mentioned hereinbefore. The memory comprises groups of M memory cells, each group being able to memorize a word of M bits (8 in the example of the figure, that is, a byte). For simplicity reasons, this figure only represents one group of memory cells, belonging to a column of rank k and to a word line R(i) of rank i. This group of memory cells arranged in line comprises a control gate transistor CGT which source terminal is connected to all the gates terminals of the transistors FGT of the group, and which gate terminal is connected to all the gates terminals of the access transistors AT of the group and to a selection line SEL(i). The sources terminals of the FGT transistors of the memory cells are connected to a global source line SL, usually controlled by a simple transistor which switches it to ground or to high impedance. Each of the drains terminals of the AT transistors of the group is connected to a bit line BL(j,k) (j being an integer between 0 and M-1). The CGT transistor provides the connection of the gates terminals of the FGT transistors of the group of memory cells with a control gate line CG(k) of the group. That way, the cells can be erased in parallel by putting them in a state conventionally associated to the value 0, the state in which they have a threshold voltage of high value.

The operations of erasing and programming memory cells are carried out thanks to latches of bit line BL(j,k) gathered into sets of latches of bit line BLL, latches of control gates lines CGL, one word lines decoder RDEC having one output per word line R(i), and one column control unit SD.

Figure 4:
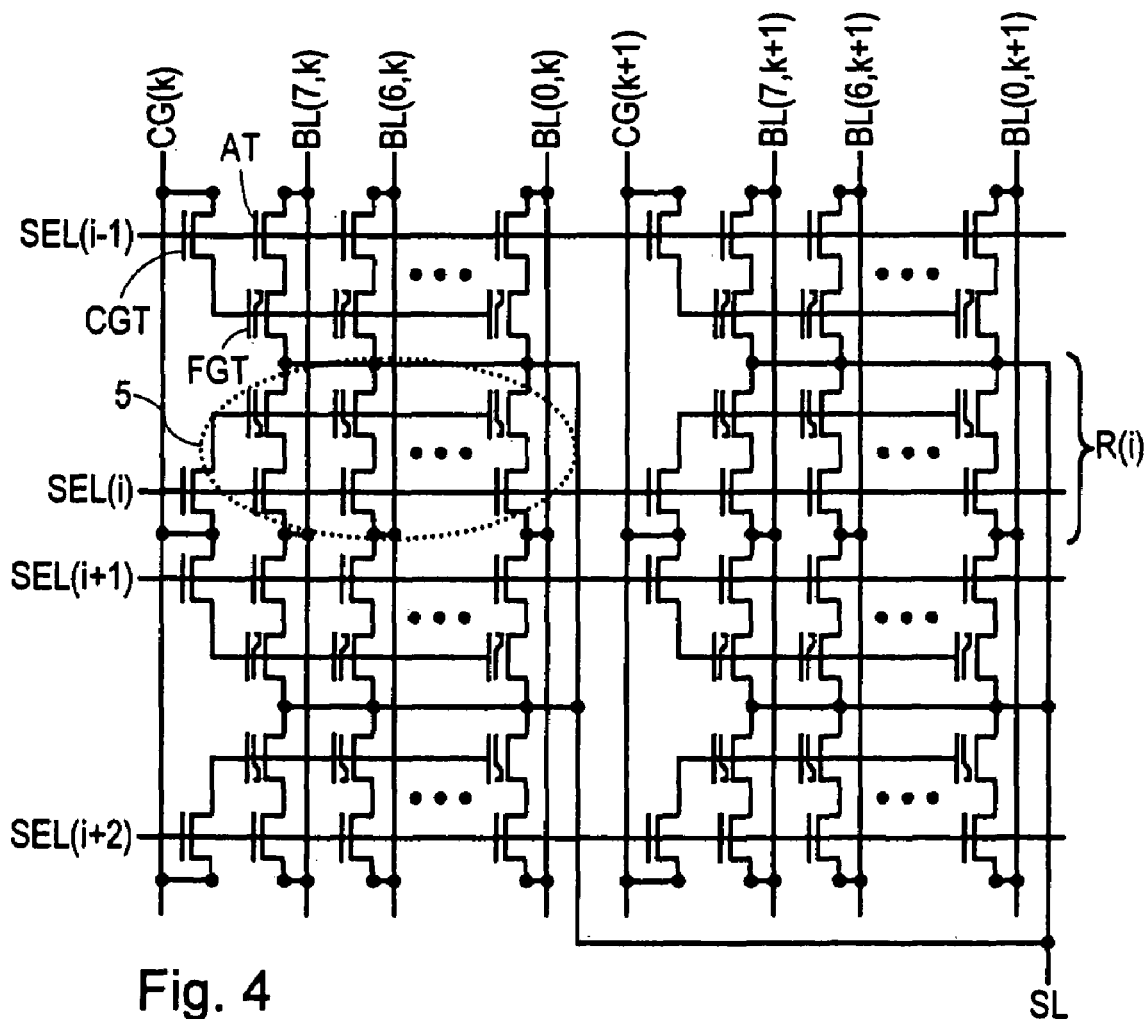

FIG. 4 represents a set of 8 groups of memory cells, as represented in FIG. 3, each group being able to memorize a word. On that figure, the groups are gathered into columns of ranks k, k+1 and into word lines of ranks i−1, i, i+1, i+2. Thus, each selection line SEL(i) is connected to the gates terminals of the AT transistors of the groups located on the same line. The source lines of the groups of each column are connected to a global source line SL.

Collective erasing of the FGT transistors of a group of memory cells belonging to a word line of rank i and a column of rank k, is carried out by applying a voltage Vpp1, of 12 V for example, on the control gate CG of the FGT transistors, via the control gate transistor CGT of the group, while the source line SL is applied 0 volt and the drain terminal of the FGT transistors via the access transistors AT is at a floating potential or high impedance. Individual programming of FGT transistors is carried out by applying the Vpp1 voltage to the drain terminals of the FGT transistors via the access transistors, while the control gate of the FGT transistors is at 0 volt, and the source line SL is applied a floating potential.

The table 1 below sums up the values of the control signals applied during the operations of erasing, programming and reading of memory cells.

TABLE 1

| Control signal | Operation | | |
|---|---|---|---|
| | ERASING | PROGRAMMING | READING |
| SEL(i) | Vpp2 | Vpp2 | VDC |
| SEL(l) (l ≠ i) | Vref | Vref | Vref |
| CG(k) | Vpp1 | Vref | Vread |
| CG(n) (n ≠ k) | Floating | Floating | Floating |
| BL(j, k) | Floating | Vpp1 | Vsense |
| BL(m, n) (m ≠ j, n ≠ k) | Floating | Floating | Floating |
| SL | Vref | Floating | Vref |

In that table, the voltage Vref is equal to 0 V (ground), the voltage Vpp2 is equal to 15 V, the voltage VDC is comprised between 3 and 5 V, the voltage Vread is comprised between the threshold voltages VT1 and VT2 and the voltage Vsense is of approximately 1 V.

The currents resulting from the Fowler-Nordheim tunneling effect in the FGT transistors mainly depend on the thickness of the tunnel oxide layer between the doped region 2 and the floating gate FG, and on the electrical field which is proportional to the voltage applied to the floating gate transistor FGT and to the capacitive coupling factor between its floating gate FG and its control gate CG, compared to the coupling of the latter with the drain terminal and the source terminal of the transistor, as well as with the rest of the cell.

It is known that the threshold voltage VT of a floating gate transistor increases if the applied voltage and the coupling factor are increased, and if the thickness of the oxide layer is decreased. However, reducing the thickness leads to reducing the period during which the floating gate can keep its charge, that is, the time for the memory cell to memorize data, which should be of several years. Consequently, so as to increase the speed of the memory, or to reduce the length of programming and erasing operations, the applied voltages should be increased and the coupling factor should be reduced. The coupling factor is hard to reduce and especially if there is an attempt to reduce the size of the memory cells at the same time. The increase of the voltages applied to the memory cells is also limited by the breakdown voltage of the drain or source junctions between the regions doped n+ and the substrate p. The breakdown voltage depends on the technology used. In the example described hereinbefore, the breakdown voltage is slightly superior to 12 V. Therefore it is not possible to submit the junctions (drain-gate) of the transistors to voltages deviations superior to 12 V.

BRIEF SUMMARY OF THE INVENTION

One embodiment of the present invention overcomes that limitation.

One embodiment of the invention provides an electrically erasable and programmable memory from which the control gate transistors CGT have been removed, the memory cells of a word line being controlled by a common selection line connected to the gates terminals of the access transistors of the memory cells of the word line, and by a common control gate line connected to the control gates of the floating gate transistors of the memory cells of the word line. Thus the voltage applicable to the gates terminals of the floating gate transistors is no longer limited by the voltage susceptible of being obtained on the source terminal of the control gate transistors.

With such an architecture, the achievement of a memory of the type erasable by word or erasable by page is determined by a mode of interconnection of the source terminals of the FGT transistors in which independent source lines are affected to the columns and are controlled by column control units.

More particularly, one embodiment of the invention provides an electrically erasable and programmable memory comprising memory cells, wherein:

each memory cell comprises a floating gate transistor arranged in series with an access transistor, the memory cells are arranged according to word lines, the gate terminals of the access transistors of the memory cells of a same word line being connected to a common selection line, and the memory cells are linked to bit lines transverse to the word lines, the bit lines being gathered into individually selectable columns.

The control gates of the floating gate transistors of the memory cells of a same word line are connected to a common control gate line, and the memory cells of each column are connected to a common source line which is individual to the column, each source line of a column being controlled by a column control unit.

According to one embodiment of the invention, the column control unit receives a column selection signal and is arranged to apply different voltages to the source line of the column depending on whether the column is selected or not.

According to one embodiment of the invention, during an erasing phase of the memory cells of a selected column:

the column control unit of the selected column applies a first voltage to the source line of the selected column, and the column control unit of a non-selected column applies an erase inhibit voltage to the source line of the non-selected column.

According to one embodiment of the invention, during an erasing phase of the memory cells of a selected word line, a line decoder unit applies a positive voltage and a reference voltage to the control gate line and to the selection line of the selected word line, respectively.

According to one embodiment of the invention, during a programming phase of the memory cells of a selected word line, a line decoder unit applies:

a first reference voltage to the control gate line of a non-selected word line, a second reference voltage, inferior to the first reference voltage, to the control gate line of the selected word line, and a positive voltage to the selection line of the selected word line.

According to one embodiment of the invention, the first reference voltage is equal to zero, and the second reference voltage is negative.

According to one embodiment of the invention, the memory comprises a double well embedded in a semiconductor substrate, into which the memory cells are formed, and means to polarize the double well at a positive supply voltage during programming operations of memory cells, the first reference voltage being a positive voltage inferior to the positive supply voltage, and the second reference voltage being equal to zero.

According to one embodiment of the invention, programming latches of bit lines selectively put the bits lines to a floating potential, and to a first reference voltage.

According to one embodiment of the invention, during a programming operation of memory cells linked to selected bit lines, programming latches of the selected bit lines apply a second positive voltage to the selected bits lines.

The invention also relates to a method for selecting memory cells in an electrically erasable and programmable memory wherein:

each memory cell comprises a floating gate transistor arranged in series with an access transistor, memory cells are arranged according to word lines and according to word columns transversal to word lines, and each word line comprises a selection line connected to the gate terminals of the access transistors of the memory cells of the word line, method for selecting memory cells by selecting a word line and a column.

Each word line comprises a control gate line which is connected to the gate terminals of the floating gate transistors of the memory cells of the word line, and each column comprises a column selection line which is linked to the floating gate transistors of the memory cells of the column. During operation:

a first voltage is applied to the selection line of a word line to be selected, a second voltage is applied to the control gate line of the word line to be selected, a third voltage is applied to a column selection line of a column not to be selected, and a fourth voltage is applied to a column selection line of a column not to be selected.

According to one embodiment of the invention, during an erasing phase of the selected memory cells, the second voltage is equal to a positive voltage, the first and third voltages are equal to a reference voltage, and the fourth voltage is equal to an inhibiting voltage different from the reference voltage.

According to one embodiment of the invention, the positive voltage is comprised between 12 and 18 V, the reference voltage is equal to zero, and the inhibiting voltage is comprised between 10 and 15 V.

According to one embodiment of the invention, during a programming phase of the selected memory cells, the first voltage is equal to a positive voltage, the second voltage is equal to a first reference voltage, a second reference voltage superior to the first reference voltage being applied to the control gate line of a word line to which none of the selected memory cells belong.

According to one embodiment of the invention, programming latches apply a second positive voltage to bits lines linked to the selected memory cells.

According to one embodiment of the invention, the first reference voltage is negative and the second reference voltage is equal to zero.

According to one embodiment of the invention, the first reference voltage is equal to zero and the second reference voltage is comprised between 2 and 5 Volts.

BRIEF DESCRIPTION OF THE SEVERAL VIEWS OF THE DRAWING(S)

Figure 5:
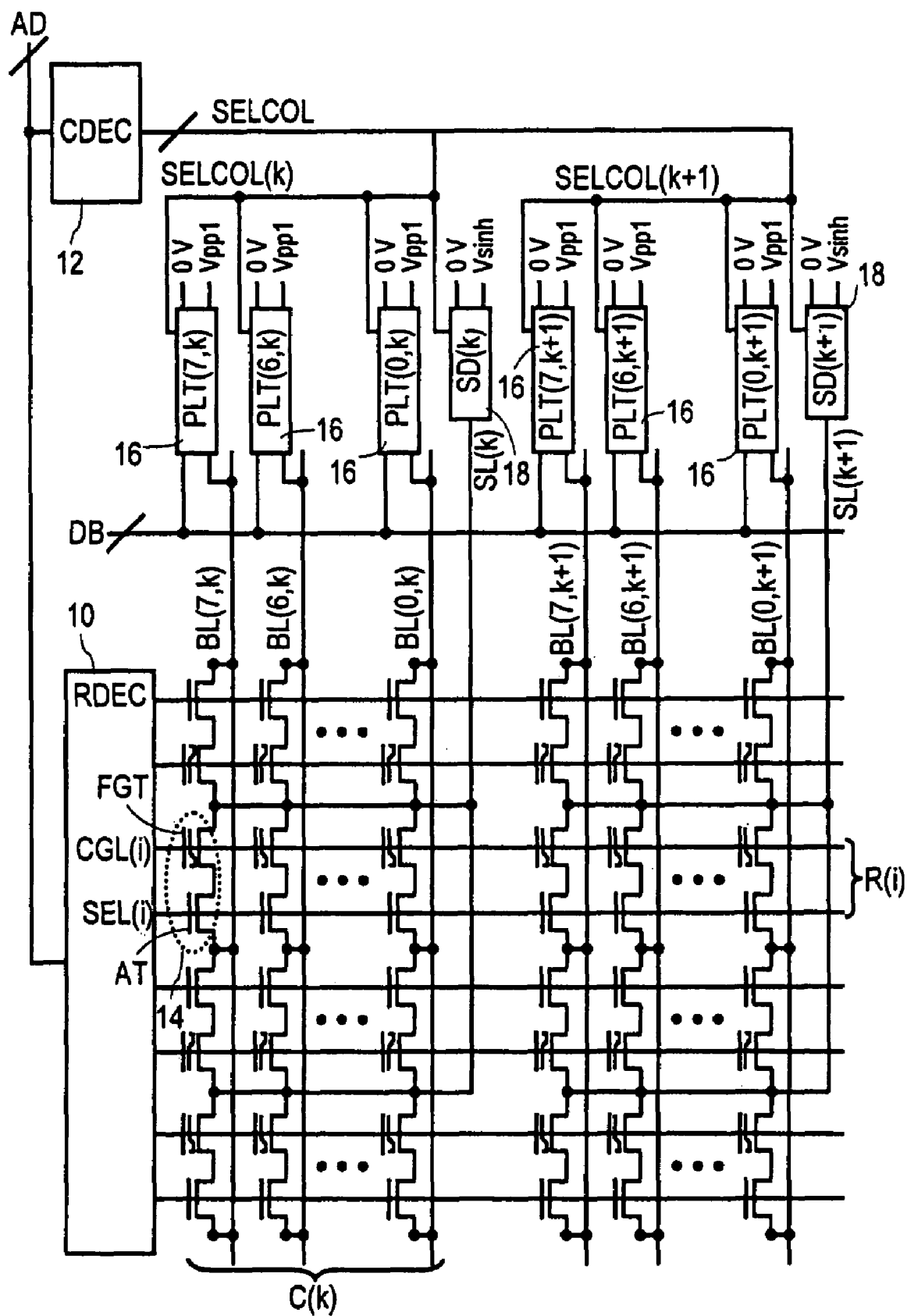
Figure 6:
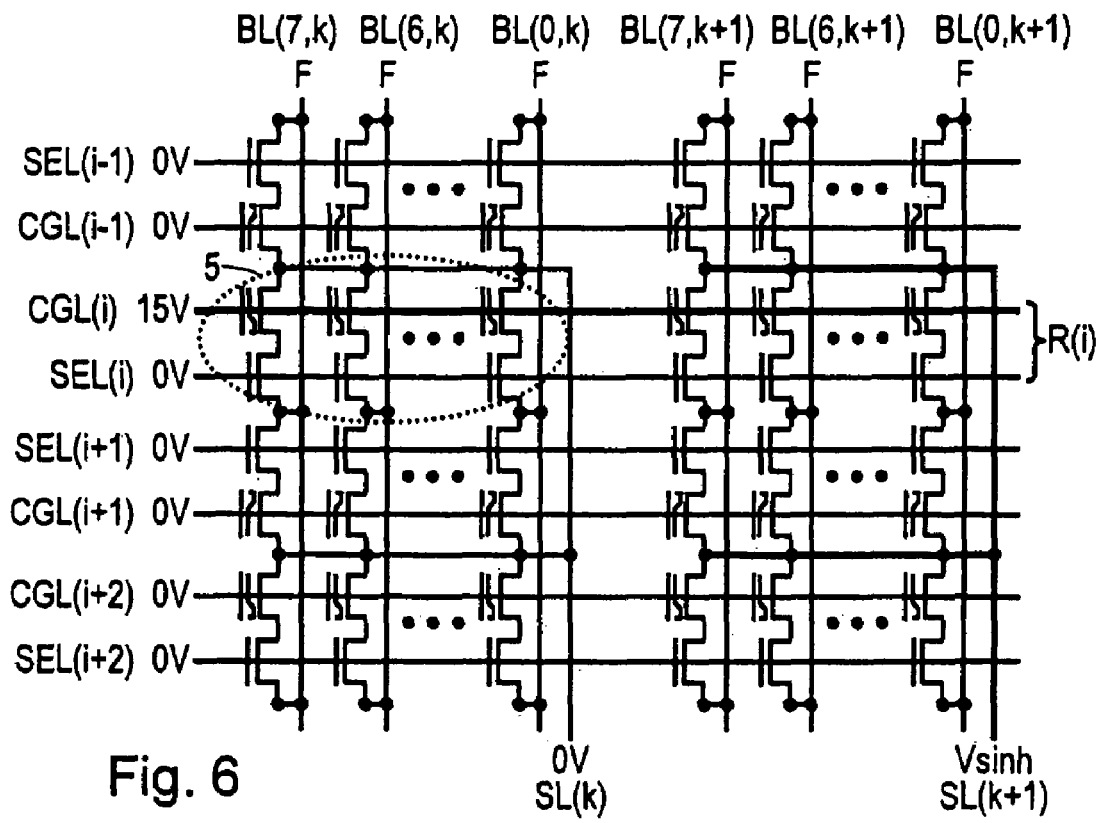
Figure 7:
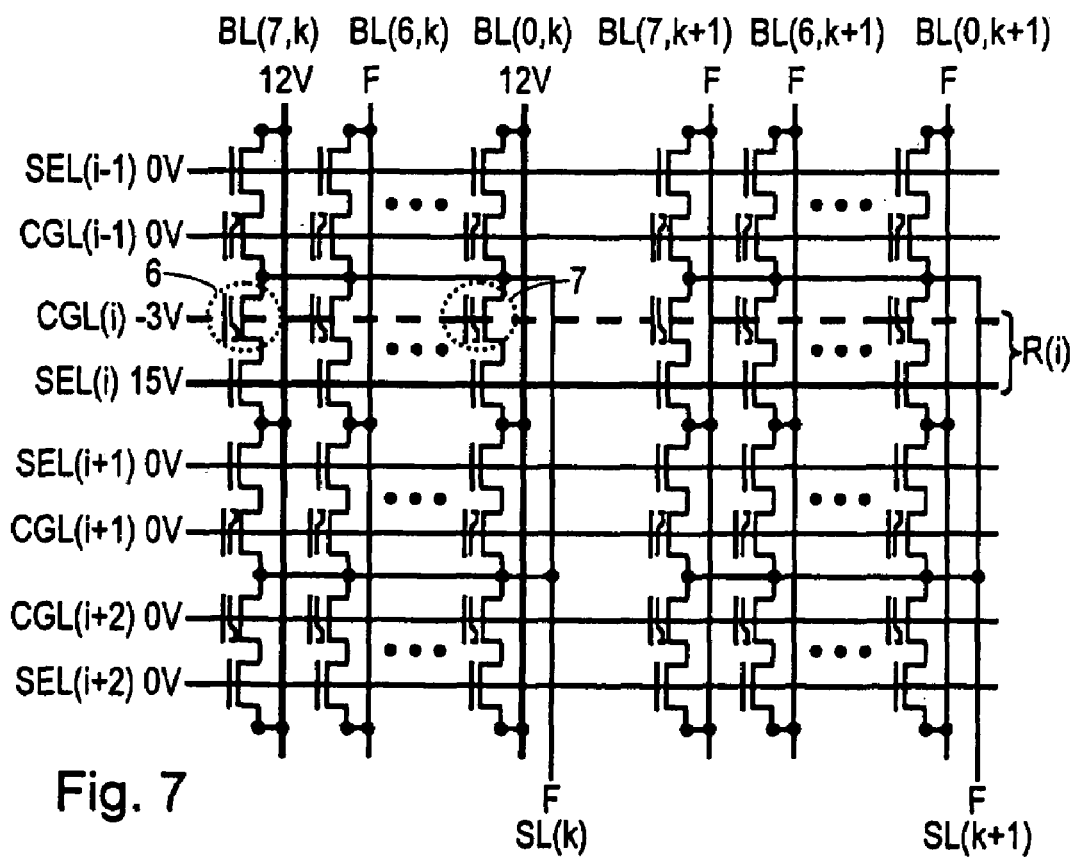
Figure 8:
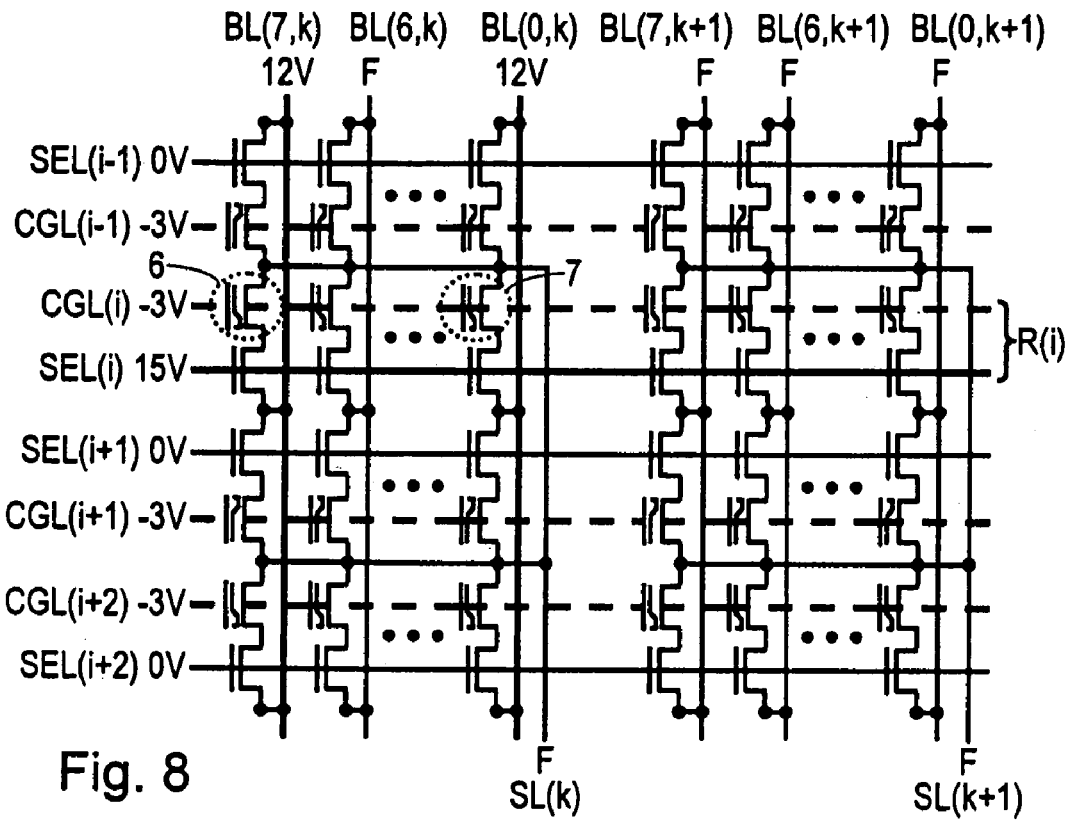
Figure 9:
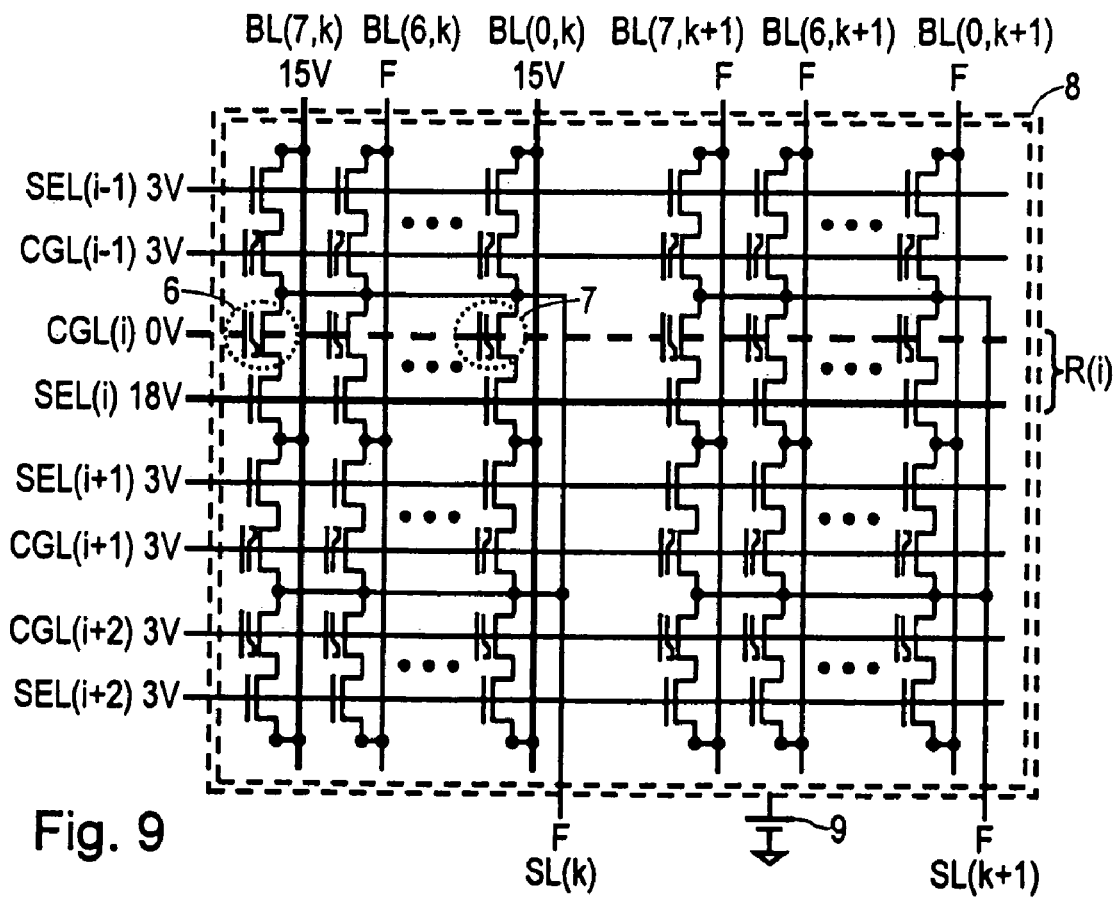

These and other advantages and features of the present invention shall be presented in greater detail in the following description of the invention, in relation, but not limited to the following figures:

FIG. 1, described hereinbefore, represents a memory cell of a classical EEPROM memory;

FIGS. 2A and 2B, described hereinbefore, respectively represent a memory cell of a classical EEPROM memory in top view and cross-sectional view;

FIG. 3, described hereinbefore, is a schematic representation of the architecture of a classical EEPROM memory;

FIG. 4, described hereinbefore, represent the architecture of a set of word lines of a classical EEPROM memory;

FIG. 5 is a schematic representation of the architecture of an EEPROM memory according to the present invention; and FIGS. 6 to 8 represent some memory cells of the EEPROM memory represented in FIG. 5 in order to illustrate erasing and programming operations; and FIG. 9 illustrates a variation of the EEPROM memory according to the invention.

DETAILED DESCRIPTION OF THE INVENTION

FIG. 5 represents an EEPROM memory according to one embodiment of the invention comprising a line decoder (RDEC) 10, a column decoder (CDEC) 12, and memory cells 14. Each memory cell classically comprises a floating gate transistor FGT arranged in series with an access transistor AT, here of MOS type.

The memory cells are arranged in word lines R(i), and the access transistors AT of the memory cells are linked, via their drain terminal, to bit lines BL(j,k) (j being an index comprised between 0 and 7 in FIG. 5) which are transverse to word lines. The bit lines are gathered into columns C(k) so as to form groups of memory cells along word lines R(i), each group comprising M memory cells and being able to memorize a binary word of M bits.

The bit lines BL(j,k) are connected to programming latches (PLT(j,k)) 16 which are controlled by column selection signals SELCOL(k) provided by the decoder CDEC. More particularly, the programming latches of the bit lines of a same column are controlled by the same column selection signal. The programming latches are also linked to a data bus DB of the memory and provide a programming voltage Vpp1 during the programming phase of memory cells. The programming voltage is provided only if the bit received via the data bus has the logic programming value (for example the value 1), because on the contrary (value 0) the target memory cell must stay in the erase state.

Still classically, the gate terminals of the access transistors AT of the memory cells of a same word line R(i) are linked to a common selection line SEL(i), which is controlled by the line decoder RDEC.

The gate terminals of the transistors FGT of the memory cells of a same word line R(i) are linked to a common control gate line CGL(i), which is also controlled by the line decoder RDEC. For this purpose, the latter comprises, for each word line R(i), a specific output different from the output controlling the selection line SEL(i).

The source lines of the memory cells of a same column C(k) are connected to a common source line SL(k). This source line SL(k) is controlled by a column control unit (SD(k)) 18, the memory comprising as many column control units 18 as columns to be selected individually, for the reasons explained below.

Thus, the distribution of the memory cells into columns so as to obtain groups of memory cells is provided here by source lines SL(k) common to all the memory cells of a same column C(k), instead of being provided by control gate transistors as it was the case in previous practice. It results that the control gate line CGL(i) of a word line R(i) may be used to control all the FGT transistors of the memory cells of the word line R(i), as mentioned above.

The column control units SD(k) are voltage switches or latches for example. The column control units SD(k) are controlled by column selection signals SELCOL(k) provided by the column decoder CDEC, and apply different voltages to the source lines depending on whether the corresponding columns are selected or not by the decoder CDEC. Thus, during an erasing phase of memory cells, the column control units SD(k) apply either a voltage equal to zero (ground) or an inhibiting voltage Vsinh to the source lines.

The line decoder RDEC and the column decoder CDEC respectively receive the most significant bits and the least significant bits of an address circulating on the address bus AD. The decoder RDEC applies control signals to the lines CGL(i) and the lines SEL(i). The decoder CDEC applies column selection signals SELCOLk to the column control units SD(k) and to the programming latches PLT(j,k). These various signals are a function of the address present on the bus AD. As the programming latches PLT(j,k) receive the column selection signals SELCOL(k), all the latches of a same column are simultaneously activated at the activation of the corresponding column control unit SD(k) so as to simultaneously program the memory cells of a same group.

In relation to the classical architecture described with reference to FIG. 3, the architecture of FIG. 5 does not comprise any control gate transistor CGT. It results that the erase voltage applicable on the control gates is no longer limited by the voltage susceptible of being supplied by the control gate transistors. The suppression of the control gate transistors also leads to reducing the area occupied by the EEPROM memory for the same stocking capacity.

For each column C(k) and each word line R(i), the operations of erasing and programming memory cells are performed by means of:

the programming latches PLT(j,k) which control the bit lines BL(j,k) of the selected column, the decoder RDEC of word lines R(i) which controls the control gate line CGL(i) and the selection line SEL(i) of the selected word line, and the column control units SD(k).

FIG. 6 shows the same set of memory cells than the one represented in FIG. 5 and shows an erasing operation of a group 5 of memory cells. Erasing the memory cells of a word line R(i) is carried out by applying a positive voltage Vpp2, comprised between 12 and 18 V, and preferably equal to 15 V, to the corresponding control gate line CGT(i) (line CGL(i) is indicated by a thicker line in FIG. 6). Simultaneously, the other control gate lines CGL(I) (with I≈i), and all the selection lines SEL(i) and source lines SL(k) are applied a reference potential Vref1, equal to 0 volt for example (grounded). In addition, all the bit lines BL(j,k) are simultaneously put to a floating potential or to high impedance.

One embodiment of the invention erases only the memory cells of a group 5 (that is a word) belonging to a column C(k) and a word line R(i). For this purpose, only the source line SL(k) of the column C(k) receives the reference voltage Vref1, while all the other source lines SL(n) (with n ≠ k), for example the source line SL(k+1) showed by a thicker line in the Figure, receive an inhibiting voltage Vsinh comprised between 10 and 15 V, and preferably equal to 12 V. Thus, the voltage drop between the control gate CG and the drain terminal of the transistors FGT is equal to 15−12=3 V, which is insufficient to cause an extraction of electrons by tunneling effect through the tunnel oxide layer of the floating gate transistors. In addition, the inhibiting voltage Vsinh has no effect on the memory cells to which it is applied because even if they are in the programmed state (with a threshold voltage slightly negative), the voltage transferred to the drain terminal is negligible (volts). These provisions make it possible to obtain an EEPROM memory erasable by word.

FIG. 7 shows the same set of memory cells than the one represented in FIG. 5, and represents a programming operation of floating gate transistors 6, 7 belonging to a group previously erased, located in a column C(k) and belonging to a word line R(i). This operation comprises the following steps of:

applying a voltage Vpp1 to the bits lines BL(j,k) of the floating gate transistors 6, 7 to be programmed, and at the same time applying a floating potential to all the other bits lines;

applying the voltage Vpp2 to the line SEL(i) (indicated by a thicker line) of the word line R(i), whereas the selection lines of the other word lines are applied the reference voltage Vref1 (grounded);

applying a reference voltage Vref2 inferior to the voltage Vref1, comprised between −2 and −5 V, and preferably equal to −3 V, to the control gate line CGL(i) (indicated in dash line in FIG. 7) of the word line R(i); and applying a floating potential to all the source lines SL(k).

The table 2 hereinafter gathers the values of the control signals during erasing and programming operations.

TABLE 2

| Control signal | Operation | |
|---|---|---|
| | ERASING | PROGRAMMING |
| CGL(i) | Vpp2 | Vref2 |
| CGL(l) (l ≠ i) | Vref1 | Vref1 |
| SEL(i) | Vref1 | Vpp2 |
| SEL(l) (l ≠ i) | Vref1 | 0 (ground) |
| BL(j, k) | Floating | Vpp1 |
| BL(m, n) (m ≠ j, n ≠ k) | Floating | Floating |

TABLE 2-continued

| Control signal | Operation | |
|---|---|---|
| | ERASING | PROGRAMMING |
| SL(k) | Vref1 | Floating |
| SL(n) (n ≠ k) | Vsinh | Floating |

The read voltages are the same of those indicated in table 1. In the example of FIGS. 6 and 7, the voltage Vref1 is equal to 0 V (ground), and the voltage Vref2 is equal to −3 V.

Applying a negative voltage to the control gate line CGL(i) of the cells to be programmed, while the associated selection line SEL(i) is at 15 V leads to increasing the deviations of voltage between the drain terminal and the control gate of the FGT transistors, and therefore increasing the programming speed of memory cells. The memory architecture also has the advantage of not limiting the level of voltage applicable to the control gates CG to a voltage inferior to the breakdown voltage of the junctions between the regions doped n+ and the substrate p. In addition it should be observed that in the previous architecture represented in FIGS. 3, 4, the control gate transistors CGT cannot apply a negative voltage on the control gates of the FGT transistors.

If it is impossible to provide a decoder able to apply a negative voltage on one line only (impossibility to form a triple well in the substrate) thanks to the technology employed to embody the memory, the negative voltage Vref2 can then be applied to all the control gate lines CGL(i) (indicated in dash line in FIG. 8).

In a variation of the invention showed in FIG. 9, the memory is formed in a double well np 8 embedded in a substrate p. The double well is polarized by a voltage source 9 to a positive voltage comprised between 2 and 5 V, and preferably equal to 3 V, so as to increase the voltage applied on the bit lines BL by the same value (3 V), that is, 15 V instead of 12 V in the example of the figures. The voltage applied to the selection line SEL(i) of the word to which the cells 6, 7 to be programmed belonged is also increased by the same value, that is, 18 V in the example represented on the figures. In like manner, the floating potentials applied to the bit lines BL(j,k) and to the source lines SL(k) are approximately equal, or superior to 3 V. This is obtained by simply applying a floating potential to the bit lines, since they are polarized via the double well. It is also possible to use a follower circuit so as to prevent the voltage applied to the lines from being inferior to 3 V.

Alternately, in a variation represented in FIG. 9, a voltage equal to zero is applied to all the control gate lines CGL(i).

It will be understood that the present invention is susceptible of various other embodiments, achievable by those skilled in the art, such as the choice of voltages to be applied on the transistors of the memory cells during the erasing, and programming operations, and the choice of the means of applying these voltages.

More particularly, the invention makes it possible to embody a memory erasable by page (one page corresponding to all the memory cells of a word line), by connecting all the source lines to a column control unit only.

The invention claimed is:

1. An electrically erasable and programmable memory comprising:

memory cells wherein each memory cell comprises a floating gate transistor arranged in series with an access transistor, and the memory cells are arranged according to word lines;

a plurality of common selection lines each connected to gate terminals of the access transistors of the memory cells of a respective one of the word lines;

bit lines extending transversely to the word lines and linked to the memory cells, the bit lines being gathered into individually selectable columns;

a plurality of common control gate lines each connected to control gates of the floating gate transistors of the memory cells of a respective one of the word lines;

a plurality of common source lines each individually connected to the memory cells of a respective one of the columns;

a plurality of column control units each controlling a respective one of the common source lines;

a line decoder unit structured to apply simultaneously, during a programming phase of the memory cells of a selected word line of the word lines:
  a first reference voltage to the control gate line of a non-selected word line of the word lines;
  a second reference voltage, inferior to the first reference voltage, to the control gate line of the selected word line; and
  a positive programming voltage to the selection line of the selected word line;

a double well embedded in a semiconductor substrate, into which the memory cells are formed; and means for polarizing the double well at a positive supply voltage during the programming phase of the memory cells and simultaneously with the first reference voltage being applied to the control gate line of the non-selected word line, the second reference voltage being applied to the control gate line of the selected word line, and the positive programming voltage being applied to the selection line of the selected word line, the first reference voltage being a positive voltage inferior to the positive programming voltage, and the second reference voltage being equal to zero.

2. The memory according to claim 1, wherein the column control unit of each column receives a column selection signal and is arranged to apply different voltages to the source line of the column depending on whether the column is selected or not.

3. The memory according to claim 2, wherein the columns include a selected column and a non-selected columns, wherein:
  the column control unit of the selected column is structured to apply a first voltage to the column source line of the selected column, during an erasing phase; and
  the column control unit of the non-selected column is structured to apply an erase inhibit voltage to the source line of the non-selected column.

4. The memory according to claim 1, wherein the line decoder unit is structured to apply a positive voltage and a ground voltage respectively to the control gate line and to the selection line of the selected word line of the word lines, during an erasing phase of the memory cells of the selected word line.

5. The memory according to claim 1, further comprising:
  a plurality of programming latches connected respectively to the bit lines and structured to selectively apply a floating potential, and a reference voltage to the respective bit lines.

6. The memory according to claim 1, further comprising programming latches connected respectively to selected bit lines and structured to apply a positive voltage to the selected bit lines.

7. A method, comprising:
selecting a memory cell in an electrically erasable and programmable memory wherein each memory cell comprises a floating gate transistor arranged in series with an access transistor, the memory cells are arranged in a double well embedded in a semiconductor substrate according to word lines and according to columns transverse to the word lines, each word line comprises a selection line connected to gate terminals of the access transistors of the memory cells of the word line, each word line comprises a control gate line connected to gate terminals of the floating gate transistors of the memory cells of the word line, and each column comprises a column selection line which is linked to the floating gate transistors of the memory cells of the column, the selecting including, during a programming phase or an erasing phase, simultaneously:
  biasing the double well at a positive supply voltage;
  applying a positive first voltage to the selection line of a selected word line of the word lines;
  applying a positive or null second voltage to the control gate line of the selected word line; and
  applying a positive third voltage to the control gate line of a non-selected word line of the word lines.

8. The method according to claim 7, wherein, during the erasing phase of the selected memory cells, the second voltage is a positive voltage, and a fourth voltage, equal to the third voltage, is applied to the selection lines.

9. The method according to claim 7, wherein, during the programming phase of the selected memory cells, the second voltage is inferior to the third voltage.

10. The method according to claim 9, wherein during the programming phase programming latches apply a positive voltage to bit lines linked to the selected memory cells.

11. The method according to claim 9, wherein during the programming phase the second voltage is equal to zero, and the third voltage is comprised between 2 and 5 V.

12. An electrically erasable and programmable memory, comprising:
  memory cells wherein each memory cell comprises a floating gate transistor arranged in series with an access transistor, and the memory cells are arranged according to word lines;
  a plurality of common selection lines each connected to gate terminals of the access transistors of the memory cells of a respective one of the word lines;
  bit lines extending transversely to the word lines and linked to the memory cells, the bit lines being gathered into individually selectable columns;
  a plurality of common control gate lines each connected to control gates of the floating gate transistors of the memory cells of a respective one of the word lines;
  a plurality of common source lines each individually connected to the memory cells of a respective one of the columns;
  a plurality of column control units each controlling a respective one of the common source lines;
  a double well embedded in a semiconductor substrate, the memory cells being formed in the double well, the double well being biased at a positive supply voltage during programming and erasing phases of the memory cells; and
  a line decoder unit structured to apply, for selecting memory cells in a selected word line of the word lines during the programming and erasing phases:

a positive first voltage to the selection line of the selected word line while the double well is biased at the positive supply voltage, a null or positive second voltage to the control gate line of the selected word line while the double well is biased at the positive supply voltage and the positive first voltage is applied to the selection line of the selected word line, and a positive third voltage to the control gate line of a non-selected word line of the word lines while the double well is biased at the positive supply voltage, the positive first voltage is applied to the selection line of the selected word line, and the null or positive second voltage is applied to the control gate line of the selected word line.

13. The memory according to claim 12, wherein the column control unit of each column receives a column selection signal and is arranged to apply different positive voltages to the source line of the column depending on whether the column is selected or not.

14. The memory according to claim 13, wherein the columns include a selected column and a non-selected column, wherein during the erasing phase of the memory cells in the selected column:

the column control unit of the selected column is structured to apply a positive voltage to the column source line of the selected column; and the column control unit of the non-selected column is structured to apply a positive erase inhibit voltage to the source line of the non-selected column.

15. The memory according to claim 12, wherein the line decoder unit is structured to apply a positive voltage to the control gate line of a selected word line of the word lines, during an erasing phase of the memory cells of the selected word line.

16. The memory according to claim 12, wherein, during the programming phase:

the second voltage is inferior to the third voltage; and the first voltage is a positive programming voltage greater than the third voltage.

17. The memory according to claim 16, wherein, during the programming phase the second voltage is equal to zero.

18. The memory according to claim 12, further comprising:

a plurality of programming latches connected respectively to the bit lines and structured to selectively apply a floating potential, and a reference voltage to the respective bit lines.

19. The memory according to claim 12, further comprising programming latches connected respectively to selected bit lines and structured to apply a positive voltage to the selected bit lines.

20. The memory according to claim 14, wherein, the erase inhibit voltage is comprised between 10 and 15 V.

21. The memory according to claim 12 wherein the second voltage is zero and the third voltage is comprised between 2 and 5 V during the programming phase.

22. The method according to claim 7, further comprising during an erasing phase:

applying positive fourth voltage to the column selection line of a selected column of the columns; and applying a positive fifth voltage, different from the fourth voltage, to the column selection line of non-selected column of the columns.

23. The method according to claim 22, wherein the fourth voltage is equal to the third voltage and the fifth voltage is an erase inhibiting voltage.

24. The method according to claim 23, wherein the erase inhibiting voltage is comprised between 10 and 15 V.

* * * * *